(12) United States Patent
Kato

(10) Patent No.: US 8,766,160 B2
(45) Date of Patent: Jul. 1, 2014

(54) SOLID-STATE IMAGING DEVICE AND IMAGING DEVICE

(71) Applicant: Olympus Corporation, Tokyo (JP)

(72) Inventor: Hideki Kato, Tokyo (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 13/963,007

(22) Filed: Aug. 9, 2013

(65) Prior Publication Data

US 2014/0054447 A1 Feb. 27, 2014

(30) Foreign Application Priority Data

Aug. 23, 2012 (JP) ................................. 2012-184436

(51) Int. Cl.
*H04N 5/335* (2011.01)

(52) U.S. Cl.
USPC ..................... 250/208.1; 250/214.1; 257/443; 348/300; 348/308

(58) Field of Classification Search
USPC ............ 250/208.1, 214.1; 257/443, 777, 778; 348/294, 300, 301, 302, 308
See application file for complete search history.

(56) References Cited

U.S. PATENT DOCUMENTS

2013/0092820 A1* 4/2013 Takemoto .................. 250/208.1
2013/0250151 A1* 9/2013 Hideki .......................... 348/300

FOREIGN PATENT DOCUMENTS

JP 2010-219339 A 9/2010

* cited by examiner

*Primary Examiner* — Kevin Pyo
(74) *Attorney, Agent, or Firm* — Westerman, Hattori, Daniels & Adrian, LLP

(57) ABSTRACT

In a solid-state imaging device and an imaging device, transistors on a first substrate are configured as N-type transistors. Of transistors on a second substrate, a sampling transistor and an analog memory reset transistor connected to an analog memory are configured as P-type transistors. A difference between the potential of back gates of the sampling transistor and the analog memory reset transistor and a potential at the time of resetting the analog memory is less than a difference between the potential of a back gate of the N-type transistor and the potential at the time of resetting the analog memory.

4 Claims, 10 Drawing Sheets

SOLID-STATE IMAGING DEVICE AND IMAGING DEVICE

BACKGROUND OF THE INVENTION

1. Field of the Invention

The present invention relates to a solid-state imaging device in which first and second substrates provided with circuit elements forming each pixel are electrically connected to each other and an imaging device including the solid-state imaging device.

Priority is claimed on Japanese Patent Application No. 2012-184436, filed Aug. 23, 2012, the content of which is incorporated herein by reference.

2. Description of Related Art

In recent years, video cameras, electronic still cameras, and the like have been universally prevalent. In such cameras, a charge coupled device (CCD) type or amplification type solid-state imaging device is used. In the amplification type solid-state imaging device, a signal charge generated and stored by a photoelectric conversion unit of a pixel on which light is incident is guided to an amplification unit installed in the pixel and a signal amplified by the amplification unit is output from the pixel. In the amplification type solid-state imaging device, a plurality of pixels are arrayed in a two-dimensional matrix. An example of the amplification type solid-state imaging device includes a complementary metal oxide semiconductor (CMOS) type solid-state imaging device that uses a CMOS transistor.

A general CMOS type solid-state imaging device uses a method of sequentially reading signal charges generated by photoelectric conversion units of respective pixels arrayed in a two-dimensional matrix form for each row. In this method, an exposure timing in the photoelectric conversion unit of each pixel is determined by the beginning and end of reading the signal charge. Therefore, the exposure timing is different for each row.

A simultaneous imaging function (global shutter function) of realizing simultaneousness of storage of signal charges has been suggested. Further, CMOS type solid-state imaging devices having the global shutter function have been used for various purposes. In the CMOS type solid-state imaging device having the global shutter function, in order to store a signal charge generated by a photoelectric conversion unit is until reading of the signal charge, it is generally necessary to provide a storage capacitor unit having a light-shielding property. In such a CMOS type solid-state imaging device, signal charges generated by the respective photoelectric conversion units are simultaneously transmitted to the photoelectric conversion units in all of the pixels and are temporarily stored after all of the pixels are simultaneously exposed. The signal charges are sequentially converted into pixel signals at predetermined reading timings to be read.

Japanese Unexamined Patent Application, First Publication No. 2010-219339 discloses a method of preventing an increase in a chip area in a solid-state imaging device in which a first substrate provided with photoelectric conversion units is bonded with a second substrate provided with a plurality of MOS transistors.

SUMMARY OF THE INVENTION

According to a first aspect of the invention, there is provided a solid-state imaging device in which a first substrate, a second substrate electrically connected to the first substrate, and circuit elements disposed in the first substrate and in the second substrate and forming pixels. Each of the pixels includes photoelectric conversion units disposed in the first substrate, a first transistor disposed in the first substrate or in the second substrate, formed at a first conductive type well layer, and configured to amplify a signal generated by the photoelectric conversion units and to output the amplified signal, a signal storage circuit disposed in the second substrate, and configured to store the amplified signal output from the first transistors, and a second transistor disposed in the second substrate, having a source terminal or a drain terminal connected to the signal storage circuit, and formed at a second conductive type well layer which is different from the first conductive type well layer. A difference between a potential of a back gate of the second transistor and a potential at a time of resetting the signal storage circuit is less than a difference between a potential of a back gate of the first transistor and the potential at the time of resetting the signal storage circuit.

According to a second aspect of the invention, in the solid-state imaging device according to the first aspect of the invention, each of the pixels may further include a third transistor disposed in the second substrate, and formed at the first conductive type well layer. In the second substrate, the first conductive type well layer or the second conductive type well layer may be shared between the pixels adjacent to each other.

According to a third aspect of the invention, in the solid-state imaging device according to the first aspect of the invention, the first transistor may be disposed in the first substrate. All of the circuit elements disposed in the second substrate may be formed at the second conductive type well layer.

According to a fourth aspect of the invention, there is provided an imaging device including the solid-state imaging device according to the first aspect of the invention.

DETAILED DESCRIPTION OF THE INVENTION

Hereinafter, embodiments of the invention will be described with reference to the drawings.

First Embodiment

Figure 1:
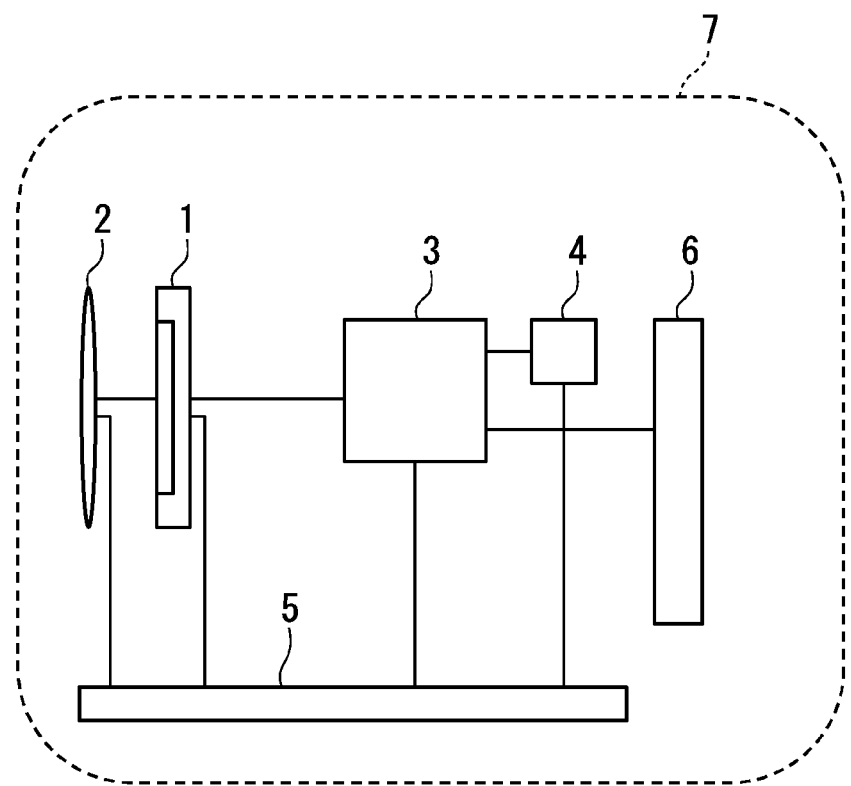
FIG. 1 is a block diagram illustrating the configuration of a digital camera according to a first embodiment of the invention.

First, a first embodiment of the invention will be described. FIG. 1 is a diagram illustrating the configuration of a digital camera which is an example of an imaging device according to this embodiment. As illustrated in FIG. 1, a digital camera 7 includes a solid-state imaging device 1, a lens unit 2, an image processing device 3, a recording device 4, a camera control device 5, and a display device 6.

The lens unit 2 includes an optical system such as a lens and forms a subject image formed by light from a subject in the solid-state imaging device 1. Driving such as zoom, focus, a diaphragm or the like of the lens unit 2 is controlled by the camera control device 5. The solid-state imaging device 1 is a MOS type imaging device that converts light of a subject incident on the digital camera 7 via the lens unit 2 into an image signal.

Driving of the solid-state imaging device 1 is controlled by the camera control device 5. The solid-state imaging device 1 will be described in detail below.

The image processing device 3 performs processes such as signal amplification on the image signal output from the solid-state imaging device 1 or conversion of the image signal into image data, and performs processes such as various corrections or compressions on the converted image data. The recording device 4 is detachably mounted on a recording medium such as a semiconductor memory and performs processes of recording and reading image data. The display device 6 is a display device such as a liquid crystal device that displays the image data based on the image signal output from the solid-state imaging device 1 or an image based on the image data read from the recording device 4.

Figure 2:
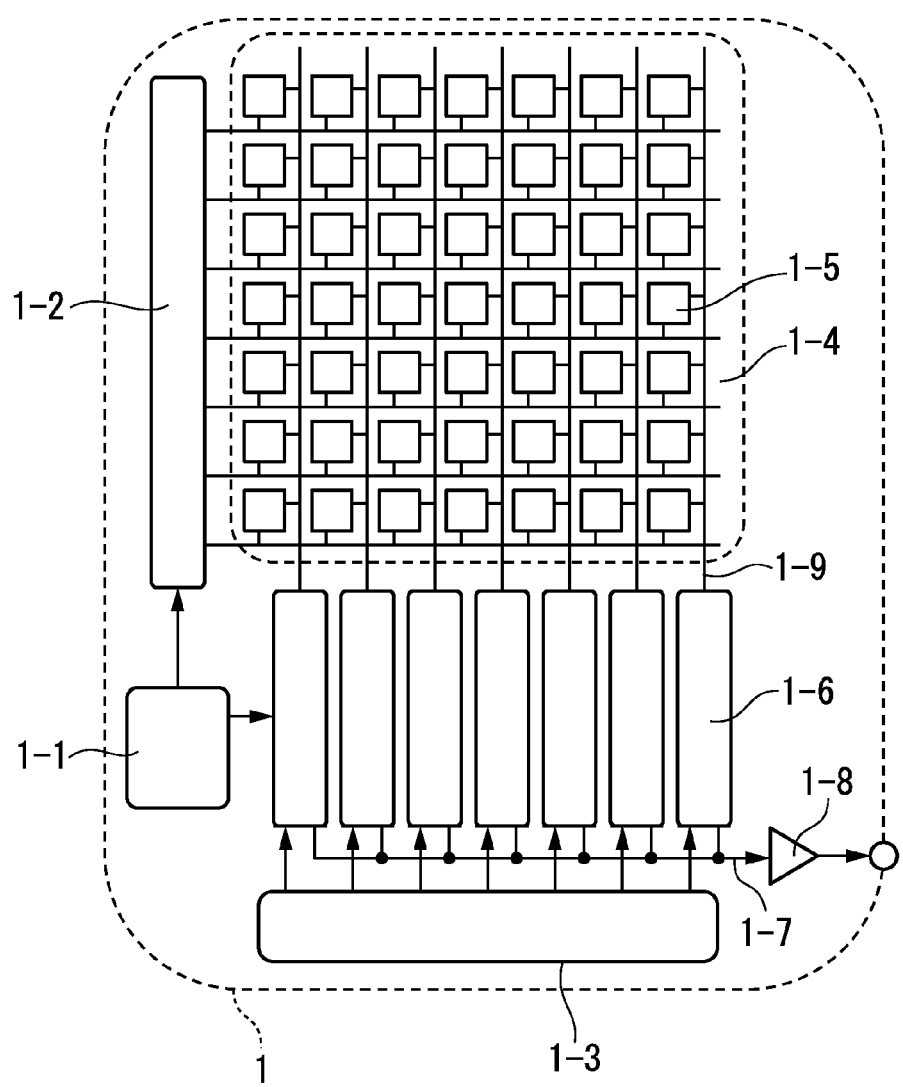
FIG. 2 is a block diagram illustrating the configuration of a solid-state imaging device according to the first embodiment of the invention.

FIG. 2 is a diagram illustrating the configuration of the solid-state imaging device 1. As illustrated in FIG. 2, the solid-state imaging device 1 includes a control signal generation circuit 1-1, a vertical reading control circuit 1-2, a horizontal reading control circuit 1-3, a pixel array unit 1-4 including a plurality of unit pixels 1-5, column signal processing unit 1-6, and an output circuit 1-8.

The control signal generation circuit 1-1 generates control signal to control the vertical reading control circuit 1-2, the horizontal reading control circuit 1-3, and the column signal processing unit 1-6 and supplies the control signal to the vertical reading control circuit 1-2, the horizontal reading control circuit 1-3, and the column signal processing unit 1-6. The vertical reading control circuit 1-2 controls the unit pixels 1-5 in the pixel array unit 1-4 in units of rows and outputs pixel signals of the unit pixels 1-5 to a vertical signal line 1-9 provided in each column. The control of the unit pixels 1-5 performed by the vertical reading control circuit 1-2 includes a reset process, a storage process, a signal reading process or the like of the unit pixels 1-5. The vertical reading control circuit 1-2 outputs a control signal (control pulse) to each unit pixel 1-5 and independently controls the unit pixel 1-5 for each row, in order to perform the control.

In the pixel array unit 1-4, the plurality of unit pixels 1-5 are arrayed in a two-dimensional matrix form. In FIG. 2, 49 unit pixels 1-5 in 7 rows×7 columns are arrayed. However, the array of the unit pixels 1-5 illustrated in FIG. 2 is merely an example, and the number of rows and the number of columns may be 2 or more.

The column signal processing unit 1-6 is connected to the vertical signal line 1-9 provided in each column and includes a column amplification circuit 1-10. The column amplification circuit 1-10 performs signal processing such as noise suppression and signal amplification before A/D conversion on the pixel signal output to the vertical signal line 1-9. The horizontal reading control circuit 1-3 sequentially reads output signal of the column signal processing unit 1-6 to the horizontal signal line 1-7. The signal read to the horizontal signal line 1-7 is output to the outside of the solid-state imaging device 1 via the output circuit 1-8.

Figure 3A:
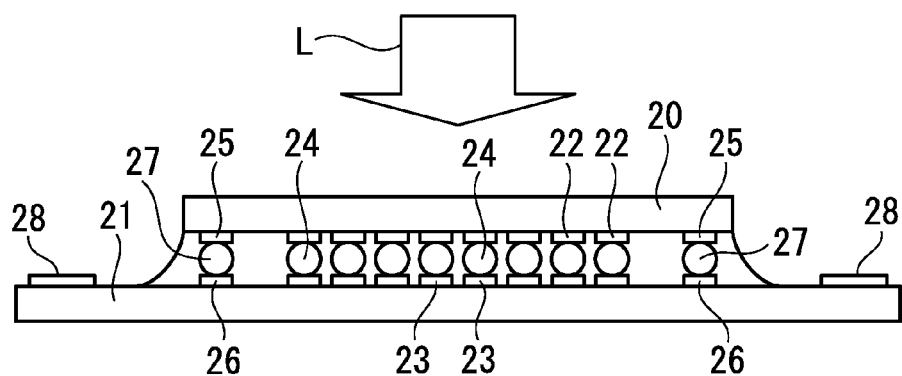
FIG. 3A is a sectional view illustrating the solid-state imaging device according to the first embodiment of the invention.
Figure 3B:
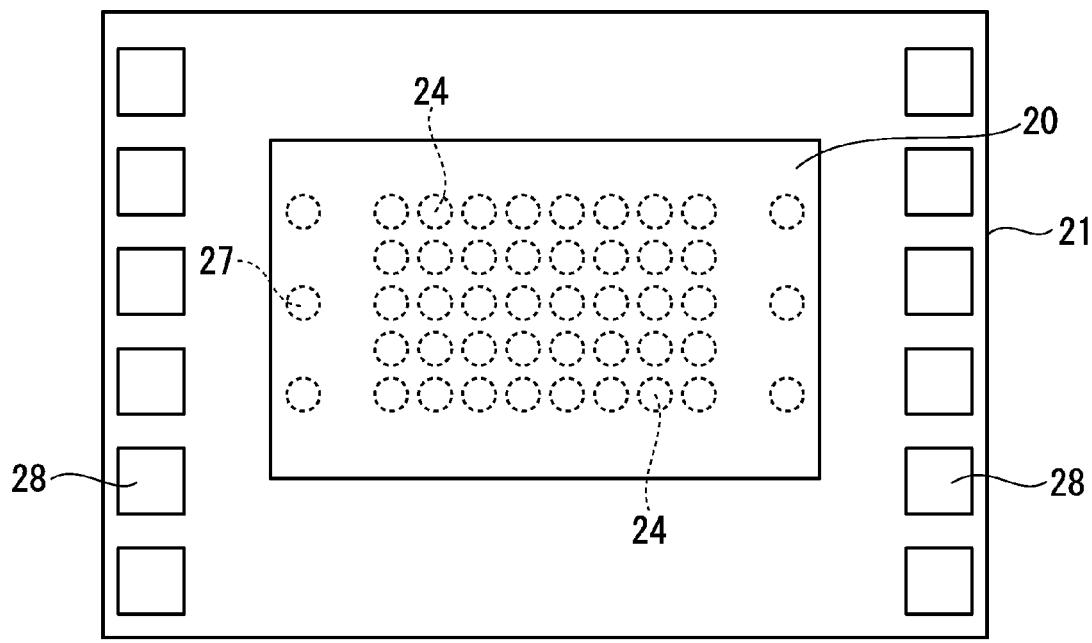
FIG. 3B is a plan view illustrating the solid-state imaging device according to the first embodiment of the invention.

FIGS. 3A and 3B are diagrams illustrating the cross-sectional configuration (FIG. 3A) and the planar configuration (FIG. 3B) of the solid-state imaging device 1. The solid-state imaging device 1 has a configuration in which two substrates (a first substrate 20 and a second substrate 21) which is disposed in circuit elements (photoelectric conversion unit, transistor, and capacitor, and the like) forming the unit pixels 1-5 overlap. The circuit elements forming the unit pixels 1-5 are distributed and disposed in the first substrate 20 and the second substrate 21. The first substrate 20 and the second substrate 21 are electrically connected to each other such that electric signals are transmitted and received between the two substrates when the unit pixels 1-5 are driven.

Of the two main surfaces (which are surfaces with a relatively larger surface area than side surfaces) of the first substrate 20, the main surface side to which light L is radiated is provided with the photoelectric conversion unit, and thus light radiated to the first substrate 20 is incident on the photoelectric conversion unit. Of the two main surfaces of the first substrate 20, the main surface opposite to the main surface to which the light L is radiated is provided with a plurality of micropads 22 serving as electrodes for connection to the second substrate 21.

One micropad 22 is disposed for one pixel or a plurality of pixels. Of the two main surface of the second substrate 21, the main surface facing the first substrate 20 is provided with a plurality of micropads 23 serving as electrodes for connection to the first substrate 20 form at the positions corresponding to the micropads 22.

A microbump 24 is formed between the micropad 22 and the micropad 23. The first substrate 20 and the second substrate 21 are integrated such that the micropads 22 and the micropads 23 overlap to face each other and the micropads 22 and the micropads 23 are electrically connected by the microbumps 24. The micropad 22, the microbump 24, and the micropad 23 form a connection portion that connects the first substrate 20 to the second substrate 21. A signal based on a signal charge generated by the photoelectric conversion unit disposed in the first substrate 20 is output to the second substrate 21 via the micropad 22, the microbump 24, and the micropad 23.

Of the two main surfaces of the first substrate 20, the circumference portion of the main surface opposite to the main surface to which the light L is radiated is provided with micropads 25 that have the same configuration as the micropad 22. In the main surface facing the first substrate 20, of the two main surfaces of the second substrate 21, micropads 26 that have the same configuration as the micropads 25 are formed at the positions corresponding to the micropads 25. A microbump 27 is formed between the micropad 25 and the micropad 26. A supply voltage or the like to drive the circuit elements disposed in the first substrate 20 or the circuit elements disposed in the second substrate 21 is supplied from the first substrate 20 to the second substrate 21 or from the second substrate 21 to the first substrate 20 via the micropad 25, the microbump 27, and the micropad 26.

Pads 28 used as interfaces with a system other than the first substrate 20 and the second substrate 21 are formed in the circumference portion of one main surface of the two main surfaces of the second substrate 21. Instead of the pads 28, penetration electrodes penetrating the second substrate 21 may be provided and the penetration electrodes may be used as electrodes for external connection. In the example illustrated in FIGS. 3A and 3B, the area of the main surfaces of the first substrate 20 and the area of the main surfaces of the second substrate 21 are different. However, the area of the main surfaces of the first substrate 20 and the area of the main surfaces of the second substrate 21 may be the same. The micropads (first electrodes) formed on the surface of the first substrate 20 may be bonded directly with the micropads (second electrodes) formed on the surface of the second substrate 21 without providing the microbumps, so that the first substrate 20 is connected to the second substrate 21.

The circuit elements forming the unit pixels 1-5 are distributed and disposed in the first substrate 20 and the second substrate 21. The control signal generation circuit 1-1, the vertical reading control circuit 1-2, the horizontal reading control circuit 1-3, the column signal processing units 1-6, and the output circuit 1-8 other than the unit pixels 1-5 may be disposed at either the first substrate 20 or the second substrate 21. Further, circuit elements forming the control signal generation circuit 1-1, the vertical reading control circuit 1-2, the horizontal reading control circuit 1-3, the column signal processing units 1-6, and the output circuit 1-8 may be distributed and disposed in the first substrate 20 and the second substrate 21, respectively. Even in the configuration other than the unit pixels 1-5, it is necessary to transmit and receive signals between the first substrate 20 and the second substrate 21 in some cases. However, as in the unit pixels 1-5, the first substrate 20 and the second substrate 21 can be connected using micropads and microbumps, or the first substrate 20 and the second substrate 21 may be connected by directly connecting the micropads to each other.

Figure 4:
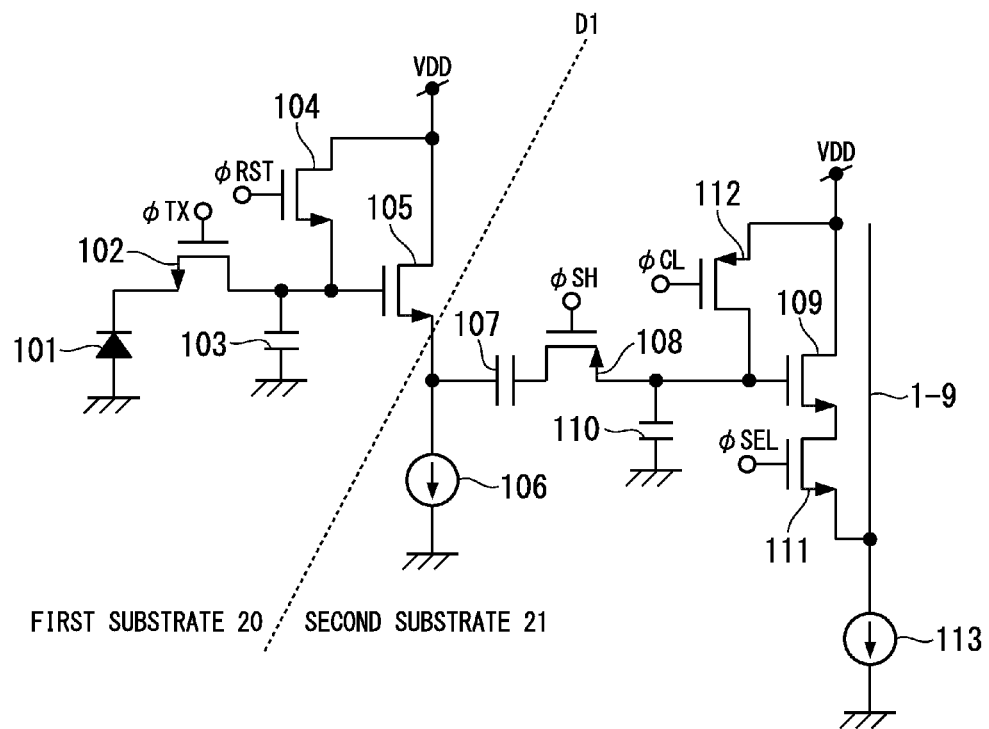
FIG. 4 is a circuit diagram illustrating a circuit configuration of a unit pixel of the solid-state imaging device according to the first embodiment of the invention.

FIG. 4 is a diagram illustrating the configuration of the unit pixel 1-5. The unit pixel 1-5 includes a photoelectric conversion unit 101, a transmission transistor 102, a floating diffusion (FD) 103, an FD reset transistor 104, an amplification transistor 105, a current source 106, a clamp capacitor 107, a sampling transistor 108, an analog memory reset transistor 112, a second amplification transistor 109, an analog memory 110, and a selection transistor 111. Outside of the unit pixel 1-5, a second current source 113 is connected to the vertical signal line 1-9.

One end of the photoelectric conversion unit 101 is grounded. A source terminal of the transmission transistor 102 is connected to the other end of the photoelectric conversion unit 101. A gate terminal of the transmission transistor 102 is connected to the vertical reading control circuit 1-2 and is thus supplied with a transmission pulse φTX.

One end of the FD 103 is connected to a drain terminal of the transmission transistor 102 and the other end of the FD 103 is grounded. A drain terminal of the FD reset transistor 104 is connected to a supply voltage VDD and a source terminal of the FD reset transistor 104 is connected to the drain terminal of the transmission transistor 102. A gate terminal of the FD reset transistor 104 is connected to the vertical reading control circuit 1-2 and is thus supplied with an FD reset pulse φRST.

A drain terminal of the amplification transistor 105 is connected to the supply voltage VDD. A gate terminal which is an input portion of the amplification transistor 105 is connected to the drain terminal of the transmission transistor 102. One end of the current source 106 is connected to a source terminal of the amplification transistor 105 and the other end of the current source 106 is grounded. For example, the current source 106 may be configured as a transistor of which a drain terminal is connected to the source terminal of the amplification transistor 105, a source terminal is grounded, and a gate terminal is connected to the vertical reading control circuit 1-2. One end of the clamp capacitor 107 is connected to the source terminal of the amplification transistor 105 and the one end of the current source 106.

A drain terminal of the sampling transistor 108 is connected to the other end of the clamp capacitor 107. A gate terminal of the sampling transistor 108 is connected to the vertical reading control circuit 1-2 and is thus supplied with a sample pulse φSH.

A source terminal of the analog memory reset transistor 112 is connected to the supply voltage VDD, and a drain terminal of the analog memory reset transistor 112 is connected to a source terminal of the sampling transistor 108. A gate terminal of the analog memory reset transistor 112 is connected to the vertical reading control circuit 1-2 and is thus supplied with a clamp and memory reset pulse φCL.

One end of the analog memory 110 is connected to the source terminal of the sampling transistor 108 and the other end of the analog memory 110 is grounded. A drain terminal of the second amplification transistor 109 is connected to the supply voltage VDD. A gate terminal which is an input portion of the second amplification transistor 109 is connected to the source terminal of the sampling transistor 108. A drain terminal of the selection transistor 111 is connected to a source terminal of the second amplification transistor 109 and a source terminal of the selection transistor 111 is connected to the vertical signal line 1-9. A gate terminal of the selection transistor 111 is connected to the vertical reading control circuit 1-2 and is thus supplied with a selection pulse φSEL. The second current source 113 is disposed outside the unit pixel 1-5. One end of the second current source 113 is connected to the selection transistor 111 of each unit pixel 1-5 via the vertical signal line 1-9. The other end of the second current source 113 is grounded.

The photoelectric conversion unit 101 is, for example, a photodiode, generates (produces) a signal charge based on incident light, and retains and stores the generated (produced) signal charge. The transmission transistor 102 is a transistor that transmits the signal charge stored in the photoelectric conversion unit 101 to the FD 103. ON/OFF of the transmission transistor 102 is controlled based on the transmission pulse φTX from the vertical reading control circuit 1-2. The FD 103 is a capacitor that temporarily retains and stores the signal charge transmitted from the photoelectric conversion unit 101.

The FD reset transistor 104 is a transistor that resets the FD 103. ON/OFF of the FD reset transistor 104 is controlled based on the FD reset pulse φRST from the vertical reading control circuit 1-2. The photoelectric conversion unit 101 can be reset by simultaneously turning on the FD reset transistor 104 and the transmission transistor 102. By resetting the FD 103/the photoelectric conversion unit 101, an amount of charge stored in the FD 103/the photoelectric conversion unit 101 is controlled and a state (potential) of the FD 103/the photoelectric conversion unit 101 is set to a reference state (a reference potential or a reset level).

The amplification transistor 105 is a transistor that outputs, from its source terminal, an amplified signal obtained by amplifying a signal which is input to its gate terminal and is based on the signal charge stored in the FD 103. The current source 106 functions as a load of the amplification transistor 105 and supplies the amplification transistor 105 with a current used to drive the amplification transistor 105. The amplification transistor 105 and the current source 106 form a source follower circuit.

The clamp capacitor 107 is a capacitor that clamps (fixes) a voltage level of the amplified signal output from the amplification transistor 105. The sampling transistor 108 is a transistor that samples and holds a voltage level of the other end of the clamp capacitor 107 and stores the voltage level in the analog memory 110. ON/OFF of the sampling transistor 108 is controlled based on the sample pulse φSH from the vertical reading control circuit 1-2.

The analog memory reset transistor 112 is a transistor that resets the analog memory 110. By resetting the analog memory 110, an amount of charge stored in the analog memory 110 is controlled and a state (potential) of the analog memory 110 is set to a reference state (a reference potential or a reset level). The analog memory 110 retains and stores an analog signal sampled and held by the sampling transistor 108.

The capacity of the analog memory 110 is set to be greater than the capacity of the FD 103. In the analog memory 110, a metal insulator metal (MIM) capacitor or a metal oxide semiconductor (MOS) capacitor which is a capacitor with a small leakage current (dark current) per unit area is more preferably used. Thus, resistance to noise is improved, and thus a high-quality signal can be obtained.

The second amplification transistor 109 is a transistor that outputs, from its source terminal, an amplified signal obtained by amplifying a signal which is input to its gate terminal and is based on the signal charge stored in the analog memory 110. The second current source 113 functions as a load of the second amplification transistor 109 and supplies a current via the vertical signal line 1-9. The second amplification transistor 109 and the second current source 113 form a source follower circuit.

The selection transistor 111 is a transistor that selects the unit pixel 1-5 and outputs a signal amplified by the second amplification transistor 109 to the vertical signal line 1-9. ON/OFF of the selection transistor 111 is controlled based on the selection pulse φSEL from the vertical reading control circuit 1-2.

Of the circuit elements illustrated in FIG. 4, the photoelectric conversion unit 101 is disposed in the first substrate 20, the analog memory 110 is disposed in the second substrate 21, and other circuit elements are disposed in any one of the first substrate 20 and the second substrate 21. A dashed line D1 in FIG. 4 indicates a boundary line between the first substrate 20 and the second substrate 21. The photoelectric conversion unit 101, the transmission transistor 102, the FD 103, the FD reset transistor 104, and the amplification transistor 105 are disposed in the first substrate 20. The current source 106, the clamp capacitor 107, the sampling transistor 108, the analog memory reset transistor 112, the analog memory 110, and the selection transistor 111 are disposed in the second substrate 21.

In this embodiment, each transistor disposed in the first substrate 20 is configured as an N-type (first conductive type) transistor. Of the transistors disposed in the second substrate 21, the sampling transistor 108 and the analog memory reset transistor 112 connected to the analog memory 110 are configured as P-type (second conductive type) transistors, and the second amplification transistor 109 and the selection transistor 111 are configured as N-type transistors.

Figure 5:
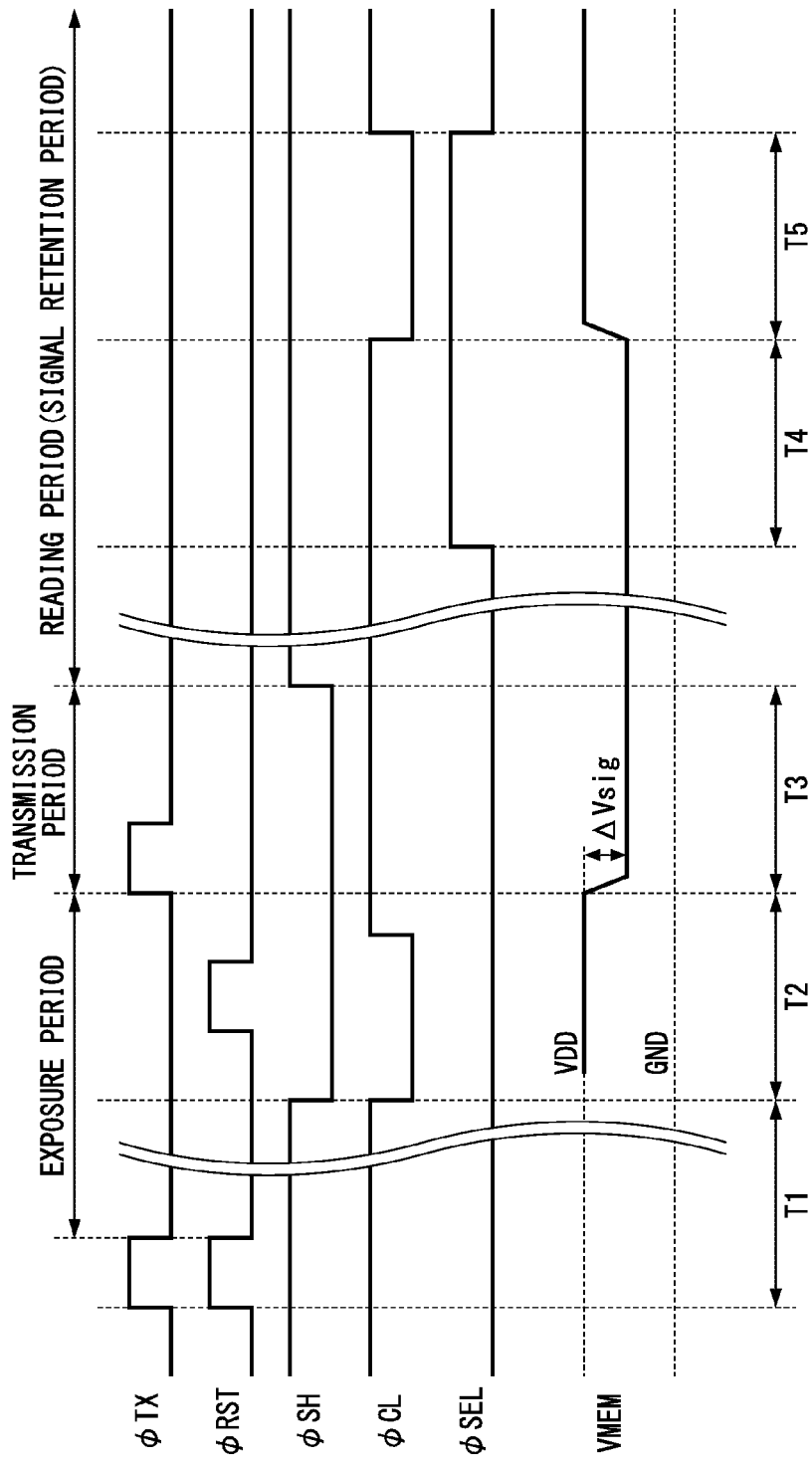
FIG. 5 is a timing chart illustrating a process of the unit pixels of the solid-state imaging device according to the first embodiment of the invention.

Next, a process of the unit pixel 1-5 will be described with reference to FIG. 5. FIG. 5 is a diagram illustrating control signals supplied from the vertical reading control circuit 1-2 to the unit pixels 1-5 for each row and a potential VMEM of one end of the analog memory 110. Hereinafter, the unit pixels 1-5 will be referred to as "all of the pixels".

[Process During Period T1]

Periods T1, T2, and T3 are periods common to all of the pixels and a process is performed simultaneously in all of the pixels. First, when the transmission pulse φTX and the FD reset pulse φRST are changed from an L (Low) level to an H (High) level, the transmission transistors 102 and the FD reset transistors 104 are turned on. Thus, the photoelectric conversion units 101 of all of the pixels are reset. Subsequently, when the transmission pulse φTX and the FD reset pulse φRST are changed from the H level to the L level, the transmission transistors 102 and the FD reset transistors 104 are turned off. Thus, the reset of all of the pixels ends and exposure (storage of the signal charge) of all of the pixels starts together (an exposure period starts).

[Process During Period T2]

First, when the memory reset pulse φCL is changed from the H level to the L level, the analog memory reset transistors 112 are turned on. Thus, the analog memory 110 of all of the pixels is reset. Simultaneously, when the sample pulse φSH is changed from the H level to the L low, the sampling transistors 108 are turned on. Thus, the potentials of the other ends of the clamp capacitors 107 of all of the pixels are reset to the supply voltage VDD and the sampling transistors 108 of all of the pixels start sampling and holding the potentials of the other ends of the clamp capacitors 107.

Next, when the FD reset pulse φRST is changed from the L level to the H level, the FD reset transistors 104 are turned on. Thus, the FDs 103 of all of the pixels are reset. Further, when the FD reset pulse φRST is changed from the H level to the L level, the FD reset transistors 104 are turned off. Thus, the reset of the FD 103 of all of the pixels ends. A reset timing of the FDs 103 may be within the exposure period. However, by resetting the FDs 103 at a timing immediately before the end of the exposure period, it is possible to reduce noise caused due to a leakage current of the FDs 103.

Next, when the memory reset pulse φCL is changed from the L level to the H level, the analog memory reset transistors 112 are turned off. Thus, the reset of the analog memories 110 of all of the pixels ends. At this time, the clamp capacitor 107 clamps the amplified signal (the amplified signal after the reset of the FD 103) output from the amplification transistor 105.

[Process During Period T3]

First, when the transmission pulse φTX is changed from the L level to the H level, the transmission transistors 102 are turned on. Thus, the signal charge stored in the photoelectric conversion unit 101 is transmitted to the FD 103 via the transmission transistor 102 and is stored in the FD 103. Thus, the exposure (storage of the signal charge) of all of the pixels ends. Next, when the transmission pulse φTX is changed from the H level to the L level, the transmission transistors 102 are turned off.

Next, when the sample pulse φSH is changed from the L level to the H level, the sampling transistors 108 are turned off Thus, the sampling transistors 108 of all of the pixels end the sampling and holding of the potentials of the other ends of the clamp capacitors 107.

[Process During Periods T4 and T5]

During periods T4 and T5, signals based on the signal charges stored in the analog memories 110 are sequentially read for each row. First, during the period T4, the selection pulse φSEL is changed from the L level to the H level, and the selection transistors 111 are turned on. Thus, a pixel signal level based on the signal charge stored in the analog memory 110 is output to the vertical signal line 1-9.

During the period T5, the memory reset pulse φCL is changed from the H level to the L level, and the analog memory reset transistor 112 is turned on. Thus, the signal stored in the analog memory 110 is reset (the potential of the analog memory 110 is changed to the supply voltage VDD), and a reset level is output to the vertical signal line 1-9.

The column signal processing unit 1-6 calculates a difference between the pixel signal level read during the period T4 and the reset level read during the period T5. Thus, reading noise occurring at the time of reading the pixel signal from the analog memory 110 is removed. Then, the selection pulse φSEL of a row from which the pixel signal is to be read is changed from the H level to the L level, and the memory reset pulse φCL is changed from the L level to the H level. Thus, the selection transistor 111 and the analog memory reset transistor 112 are turned off, and thus the reading of the pixel signal is completed. The process is performed sequentially for each row so that the pixel signals of all of the pixels are read. Since the signal charges stored in the photoelectric conversion units 101 of all of the pixels are collectively transmitted in the above-described process, it is possible to realize simultaneousness of the storage of the signal charges.

Hereinafter, a change in the potential VMEM of the one end of the analog memory 110 will be described. When the memory reset pulse φCL is changed to the L level during the period T2 in FIG. 5, the potential VMEM of the analog memory 110 is changed to the supply voltage VDD. Thereafter, when the memory reset pulse φCL is changed to the H level, the transmission pulse φTX is changed to the H level during the period T3. Thus, the potential VMEM of the analog memory 110 is lowered from the supply voltage VDD by a voltage ΔVsig corresponding to the signal charge stored in the photoelectric conversion unit 101. Then, when the sampling pulse φSH is changed to the L level, the sampling transistor 108 is turned off and enters a signal retention period. Thereafter, during the period T5, the memory reset pulse φCL is changed to the H level again. Thus, the potential VMEM of the analog memory 110 is changed to the supply voltage VDD, and thus the signal retention period ends.

In Japanese Unexamined Patent Application, First Publication No. 2010-219339, a transistor connected to a storage capacitor unit is configured as an N-type transistor. Therefore, when the ground voltage is assumed to be GND, the potential of a back gate of the transistor is GND. When the stored signal charge is small, a potential to be applied to the storage capacitor unit is close to VDD which is a reset potential. This means that a potential difference between a diffusion region and the back gate of the transistor connected to the storage capacitor unit is VDD−GND. That is, a relatively large reverse bias is applied to a parasitic diode between the diffusion region and the back gate. In particular, when the signal level is small, a leakage current becomes abundant, thereby considerably deteriorating signal quality.

In this embodiment, on the other hand, the potential VMEM of the analog memory 110 during the signal retention period is the potential lowered from the supply voltage VDD by ΔVsig. The potential of back gates of the analog memory reset transistor 112 and the sampling transistor 108 connected to the analog memory 110 is the supply voltage VDD and a potential difference between the back gate and the source is ΔVsig. When the potential difference ΔVsig is less than the potential difference VDD−GND between the back gate and the source in Japanese Unexamined Patent Application, First Publication No. 2010-219339, the leakage current decreases, and thus the signal quality deteriorates less. As ΔVsig is smaller, the leakage current further decreases. Therefore, the signal quality deteriorates less.

In this embodiment, the unit pixel 1-5 may be configured such that a difference between the potential (in the above-described example, VDD) of the back gates of the analog memory reset transistor 112 and the sampling transistor 108 configured as the P-type transistors and the reset potential (in the above-described example, VDD) of the analog memory 110 is less than a difference between the potential (in the above-described example, GND) of the back gates of the N-type transistors configuring the transmission transistor 102, the FD reset transistor 104, and the amplification transistor 105 in the first substrate 20 and the reset potential (in the above-described example, VDD) of the analog memory 110. In this configuration, when ΔVsig above is less than VDD−GND, the leakage current decreases, as described above, and thus the signal quality deteriorates less.

In this embodiment, both the sampling transistor 108 and the analog memory reset transistor 112 are configured as the P-type transistors. However, one of the sampling transistor 108 and the analog memory reset transistor 112 may be configured as a P-type transistor and the other thereof may be configured as an N-type transistor. Even in this case, the leakage current decreases more than when both the sampling transistor 108 and the analog memory reset transistor 112 are configured as N-type transistors. Thus, the signal quality deteriorates less.

Next, the layout of the unit pixels 1-5 disposed in the second substrate 21 according to this embodiment will be described. In each unit pixel 1-5 disposed in the second substrate 21, the second amplification transistor 109 and the selection transistor 111 are configured as the N-type transistors, and the analog memory reset transistor 112 and the sampling transistor 108 are configured as the P-type transistors. The N-type transistor is formed on a P well formed in a P-type or N-type semiconductor substrate and includes an N-type diffusion region formed on the surface of the P well. The P-type transistor is formed in an N well formed in a P-type or N-type semiconductor substrate and includes a P-type diffusion region formed on the surface of the N well.

In general, a distance between the transistor formed on the P well and the transistor formed on the N well is required to be greater than a distance between transistors formed on the same well.

For this reason, when unit pixels on a single substrate are formed so that P and N wells coexist, an area may increase.

Figure 6:
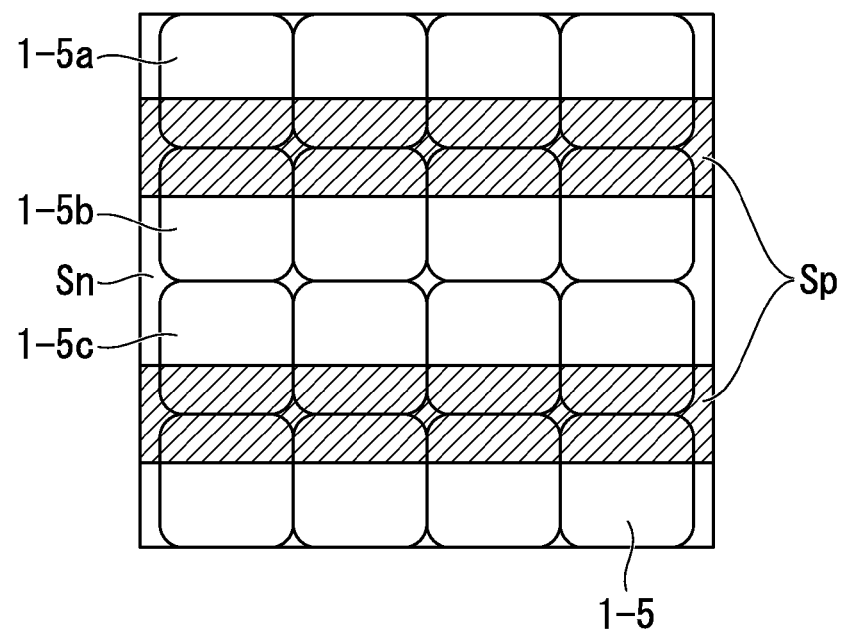
FIG. 6 is a reference diagram illustrating the layout of the unit pixels of the solid-state imaging device according to the first embodiment of the invention.

FIG. 6 is a diagram illustrating the layout of the unit pixels 1-5 in the second substrate 21. An example in which the unit pixels 1-5 are disposed in 4 rows by 4 columns will be described. A region Sp is a region in which a P well is formed and a region Sn is a region in which an N well is formed. In a plan view of the second substrate 21, the strip-shaped regions Sp and the regions Sn are alternately disposed, and the regions Sp and Sn are shared between the unit pixels 1-5 adjacent in the vertical direction. For example, the region Sp is shared between the adjacent unit pixels 1-5a and 1-5b, and the region Sn is shared between the adjacent unit pixels 1-5b and 1-5c.

Thus, even when the P wells and the N wells coexist in the unit pixels 1-5 which is disposed in the second substrate 21, the number of boundaries between the regions Sp and Sn can be further reduced by sharing the well regions, compared to the case in which each well is formed in each unit pixel 1-5. That is, a distance between the transistors in the adjacent unit pixels 1-5 can be narrowed.

In this embodiment, as described above, since a potential difference to be applied to a parasitic diode between the diffusion region and the back gate of the transistor (in this embodiment, the sampling transistor 108 and the analog memory reset transistor 112) of which a source terminal and a gate terminal are connected to the analog memory 110 decreases, the leakage current is prevented from occurring. Thus, the deterioration in the signal quality can be reduced. Further, by sharing the region Sp in which the P well is formed or the region Sn in which the N well is formed in the adjacent unit pixels 1-5, it is possible to prevent the area of the unit pixel 1-5 from increasing.

Figure 7:
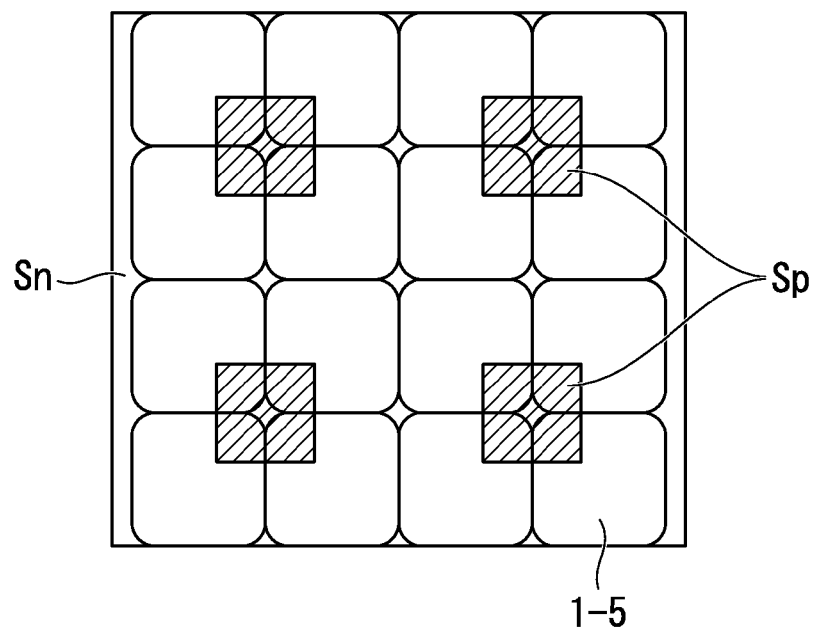
FIG. 7 is a reference diagram illustrating the layout of the unit pixels of the solid-state imaging device according to the first embodiment of the invention.

In this embodiment, the boundary between the regions Sp and Sn grows in a lateral direction. However, the present invention is not limited thereto, as long as the region Sp or the region Sn may be shared by the adjacent unit pixels 1-5. For example, even when the boundary between the regions Sp and Sn grows in a longitudinal direction, or even when the region Sp or the region Sn is disposed in a part of 4 pixels as illustrated in FIG. 7, it is possible to prevent the area of the unit pixel 1-5 from increasing.

Second Embodiment

Next, a second embodiment of the invention will be described. The configuration of an imaging device according to this embodiment is the same as the configuration of the imaging device according to the first embodiment except for a unit pixel 1-5.

Figure 8:
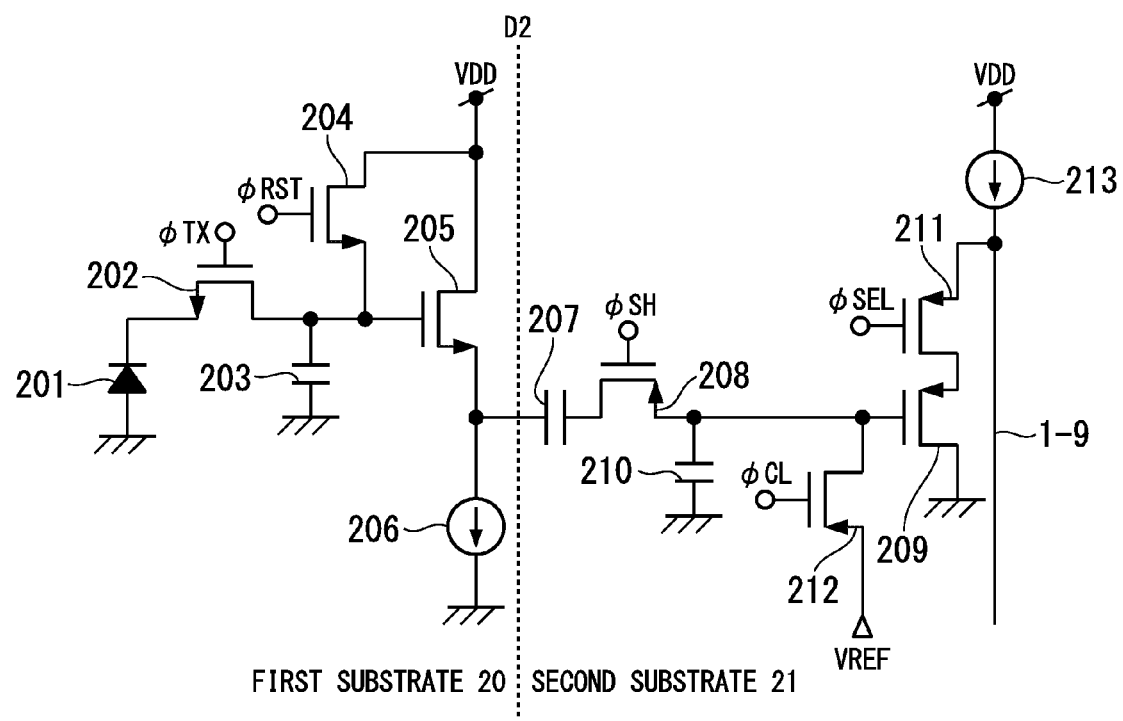
FIG. 8 is a circuit diagram illustrating a circuit configuration of a unit pixel of a solid-state imaging device according to a second embodiment of the invention.

FIG. 8 is a diagram illustrating the configuration of the unit pixel 1-5 according to this embodiment. The unit pixels 1-5 include a photoelectric conversion unit 201, a transmission transistor 202, an FD 203, an FD reset transistor 204, an amplification transistor 205, a current source 206, a clamp capacitor 207, a sampling transistor 208, an analog memory reset transistor 212, a second amplification transistor 209, an analog memory 210, and a selection transistor 211. Outside of the unit pixel 1-5, a second current source 213 is connected to the vertical signal line 1-9.

The configuration of the unit pixel 1-5 is different between the first and second embodiments as follows. In the first embodiment, the transistors disposed in the first substrate 20 are configured as the N-type transistors and the sampling transistor 108 and the analog memory reset transistor 112 disposed in the second substrate 21 are configured as the P-type transistors. In the second embodiment, on the other hand, not only the sampling transistor 208 and the analog memory reset transistor 212 but also the second amplification transistor 209 and the selection transistor 211 are configured as P-type transistors. As indicated by a dashed line D2, the current source 206 is disposed in the first substrate 20 and is configured as an N-type transistor.

Thus, of the transistors forming the unit pixels 1-5, all transistors disposed in the first substrate 20 are configured as the N-type transistors and all transistors disposed in the second substrate 21 are configured as the P-type transistors. A source terminal of the analog memory reset transistor 212 is connected to a reference voltage VREF. Since the second amplification transistor 209 is configured as the P-type transistor, the second current source 213 that forms a source follower circuit together with the second amplification transistor 209 is also required to be configured as the P-type transistor.

Figure 9:
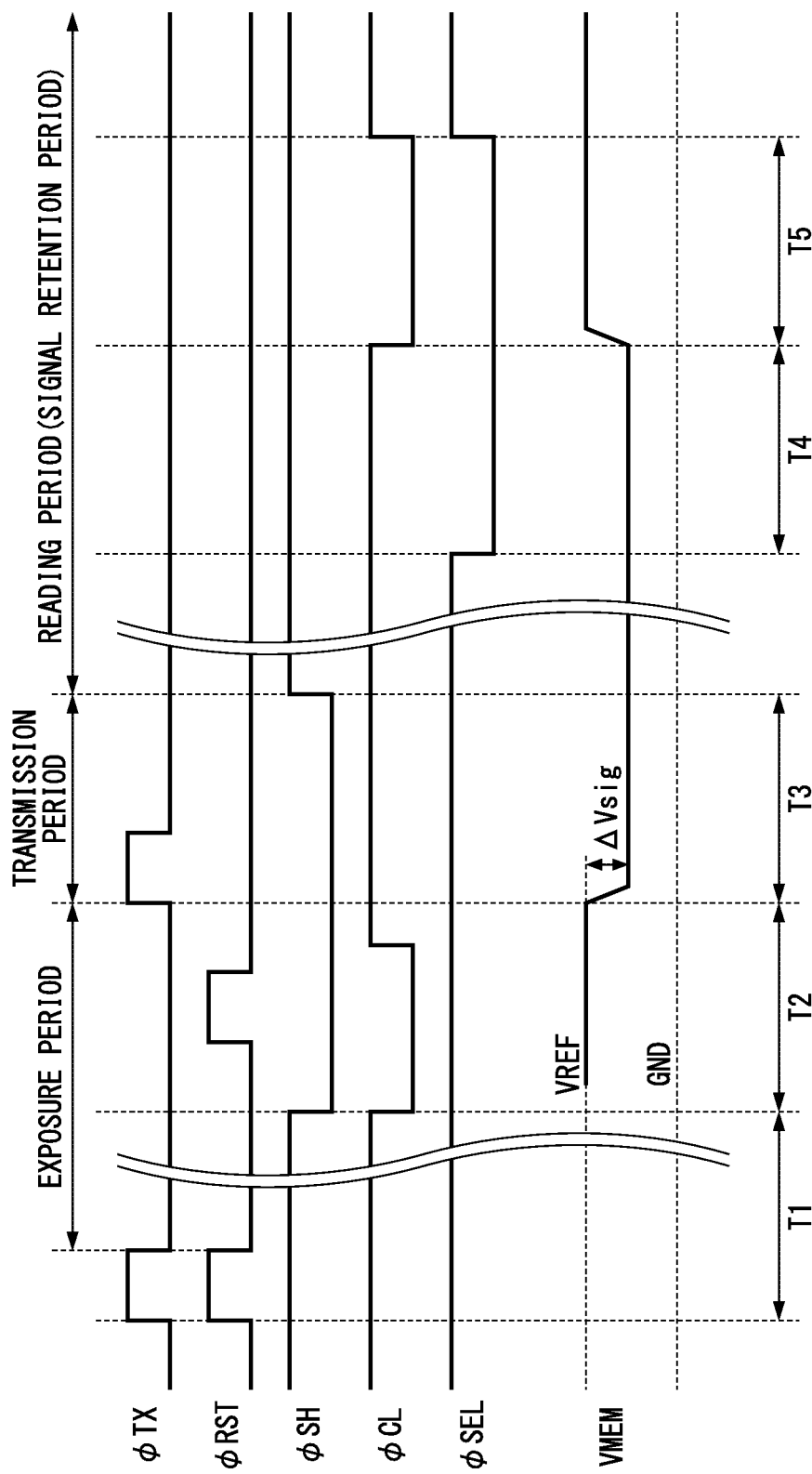
FIG. 9 is a timing chart illustrating a process of the unit pixels of the solid-state imaging device according to the second embodiment of the invention.

FIG. 9 is a diagram illustrating control signals supplied from the vertical reading control circuit 1-2 to the unit pixels 1-5 for each row and a potential VMEM of one end of the analog memory 210. The selection transistor 211 disposed in the second substrate 21 is the P-type transistor. Therefore, when a control pulse to be input to the gate terminal is in the L level state, the selection transistor 211 is in the ON state. When the control pulse to be input to the gate terminal is in the H level state, the selection transistor 211 is in the OFF state. The ON state and the OFF state are reversed compared to the case in which the selection transistor 211 is configured as the N-type transistor. Accordingly, replacement of the L level and the H level of each control signal in FIG. 5 is illustrated in FIG. 9. In FIG. 9, the reset potential of the analog memory 210 is changed from VDD to VREF. Since other details are the same as those in FIG. 5 and the driving method is not changed, the description of a detailed process is omitted.

As described above, the transistors forming the unit pixel 1-5 are configured as the same type of transistors in each of the first substrate 20 and the second substrate 21. Thus, the unit pixel 1-5 disposed in the first substrate 20 can be formed as a P well and the unit pixel 1-5 disposed in the second substrate 21 can be formed as an N well.

Figure 10:
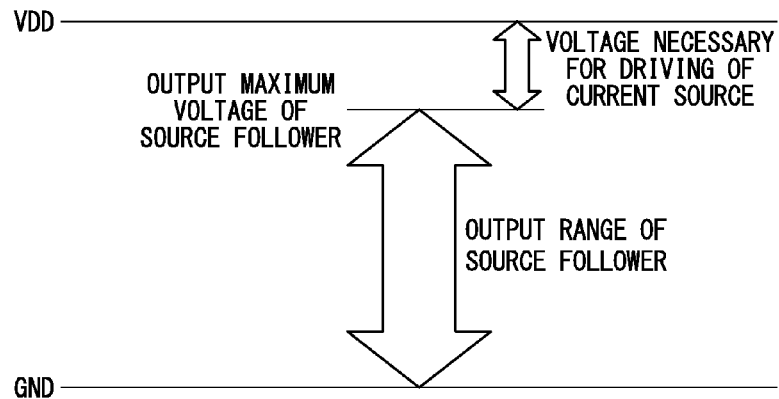
FIG. 10 is a reference diagram illustrating an output range of a source follower circuit of the solid-state imaging device according to the second embodiment of the invention.

FIG. 10 is a diagram illustrating an output range of a source follower circuit when the transistor disposed in the second substrate 21 is configured as a P-type transistor. The upper limit of the output of the source follower circuit is a voltage equal to or less than a voltage necessary for normal driving of the current source. When an input voltage is a supply voltage VDD, a signal may not be output from the source follower circuit. A reference voltage VREF (where VREF<VDD) in this embodiment is a reset level of the analog memory 210 and is a voltage at which the second current source 213 can operate normally. The reference voltage VREF may be set to have a value as close to the supply voltage VDD as possible.

The potential VMEM of one end of the analog memory 210 during the signal retention period is a potential lowered from the reference voltage VREF by the voltage ΔVsig corresponding to a signal charge stored in the photoelectric conversion unit 201. The potential of the back gates of the analog memory reset transistor 212 and the sampling transistor 208 connected to the analog memory 210 is the supply voltage VDD, and a potential difference between the back gate and the source of the transistor is VDD−(VREF−ΔVsig). When this potential difference is less than the potential difference VDD−GND between the back gate and the source in Japanese Unexamined Patent Application, First Publication No. 2010-219339, the leakage current decreases, and thus the signal quality deteriorates less. As VREF has a value closer to VDD, or ΔVsig is smaller, the leakage current further decreases. Therefore, the signal quality deteriorates less.

In this embodiment, the unit pixel 1-5 may be configured such that the magnitude of a difference between the potential (in the above-described example, VDD) of the back gates of the analog memory reset transistor 212 and the sampling transistor 208 configured as the P-type transistors and the reset potential (in the above-described example, VREF) of the analog memory 210 is less than the magnitude of a difference between the potential (in the above-described example, GND) of the back gates of the N-type transistor configuring the transmission transistor 202, the FD reset transistor 204, and the amplification transistor 205 in the first substrate 20 and the reset potential (in the above-described example, VREF) of the analog memory 210. In the above example, since VDD−VREF<VREF−GND and VREF<VDD, VDD−VREF<VDD−GND. In this configuration, when VDD−

(VREF−ΔVsig) above is less than VDD−GND, the leakage current decreases, as described above, and thus the signal quality deteriorates less.

In this embodiment, both the sampling transistor 208 and the analog memory reset transistor 212 are configured as the P-type transistors. However, one of the sampling transistor 208 and the analog memory reset transistor 212 may be configured as a P-type transistor and the other thereof may be configured as an N-type transistor. Even in this case, the leakage current decreases more than when both the sampling transistor 208 and the analog memory reset transistor 212 are configured as N-type transistors. Thus, the signal quality deteriorates less.

In this embodiment, as described above, the well configuring the unit pixel 1-5 on each of the first substrate 20 and the second substrate 21 is singular, and thus an increase in a circuit area can be suppressed. By setting the reset level to the reference voltage VREF, an output range of the source follower circuit can be ensured and a leakage current can be prevented from occurring. Thus, the deterioration in the signal quality can be reduced.

Third Embodiment

Next, a third embodiment of the invention will be described. The configuration of an imaging device according to this embodiment is the same as the configuration of the imaging device according to the first embodiment except for a unit pixel 1-5.

Figure 11:
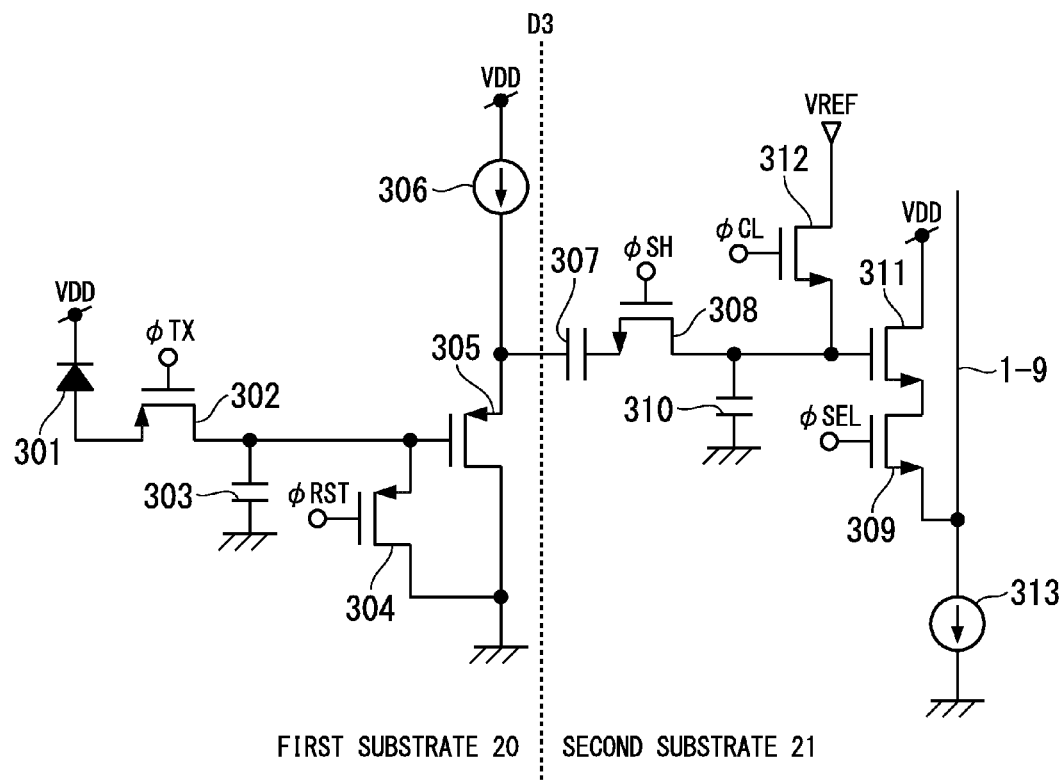
FIG. 11 is a circuit diagram illustrating a circuit configuration of a unit pixel of a solid-state imaging device according to a third embodiment of the invention.

FIG. 11 is a diagram illustrating the configuration of the unit pixel 1-5 in this embodiment. The unit pixels 1-5 includes a photoelectric conversion unit 301, a transmission transistor 302, an FD 303, an FD reset transistor 304, an amplification transistor 305, a current source 306, a clamp capacitor 307, a sampling transistor 308, an analog memory reset transistor 312, a second amplification transistor 309, an analog memory 310, and a selection transistor 311. Outside of the unit pixel 1-5, a second current source 313 is connected to the vertical signal line 1-9.

A dashed line D3 in FIG. 11 indicates a boundary line between a first substrate 20 and a second substrate 21. In FIG. 11, the circuit elements such as the transistors and the photoelectric conversion unit on the first substrate 20 formed on the P well in FIG. 8 are formed on an N well. The circuit elements such as the transistors on the second substrate 21 formed on the N well in FIG. 8 are formed on a P well. That is, the N-type transistors formed on the first substrate 20 are substituted with the P-type (first conductive type) transistors and the potential of a back gate is changed from the ground voltage GND to the supply voltage VDD. Further, the P-type (second conductive type) transistors formed on the second substrate 21 are substituted with the N-type transistors. The potential of a back gate is changed from the supply voltage VDD to the ground voltage GND.

The potential VMEM of one end of the analog memory 310 during the signal retention period is a potential raised from the reference voltage VREF by the voltage ΔVsig corresponding to a signal charge stored in the photoelectric conversion unit 301. The potential of the back gates of the analog memory reset transistor 312 and the sampling transistor 308 connected to the analog memory 310 is the ground voltage GND, and a potential difference between the back gate and the source of the transistor is VREF+ΔVsig−GND.

Figure 12:
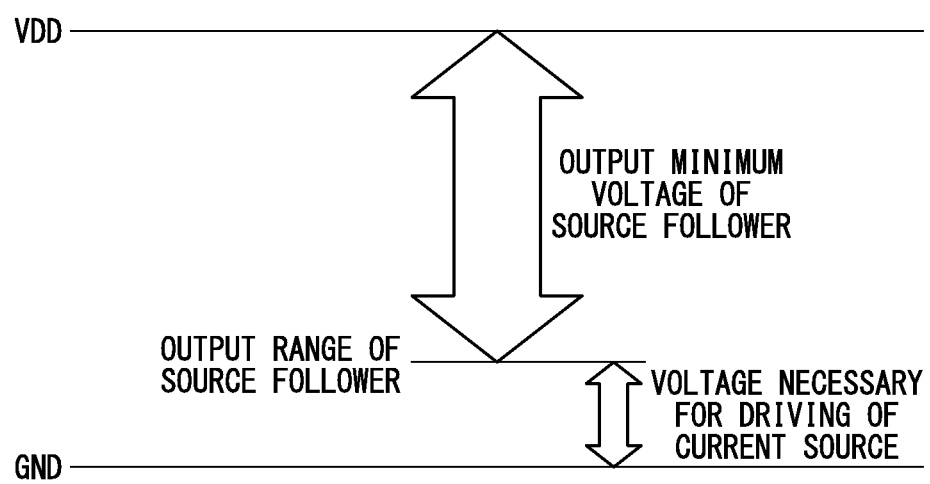
FIG. 12 is a reference diagram illustrating an output range of a source follower circuit of the solid-state imaging device according to the third embodiment of the invention.

When the unit pixel 1-5 is configured as in FIG. 11, the second amplification transistor 309 is configured as an N-type transistor and means outputting a signal to the vertical signal line 1-9 is a source follower circuit configured as an N-type transistor. FIG. 12 is a diagram illustrating an output range of the source follower circuit configured as the N-type transistor. This source follower circuit configured as the P-type transistor is different from the source follower circuit illustrated in FIG. 10. An output range of the source follower circuit is in a range of a voltage necessary for normal driving of the current source to the supply voltage VDD. Therefore, the reference voltage VREF is required to be equal to or greater than the voltage necessary for the normal driving of the current source.

In this embodiment, the unit pixel 1-5 may be configured such that a difference between the potential (in the above-described example, GND) of the back gates of the analog memory reset transistor 312 and the sampling transistor 308 configured as the N-type transistors and the reset potential (in the above-described example, VREF) of the analog memory 310 is less than a difference between the potential (in the above-described example, VDD) of the back gates of the P-type transistors configuring the transmission transistor 302, the FD reset transistor 304, and the amplification transistor 305 in the first substrate 20 and the reset potential (in the above-described example, VREF) of the analog memory 310. In this configuration, when VREF+ΔVsig−GND above is less than VDD−GND, the leakage current decreases, and thus the signal quality deteriorates less. As VREF has a value closer to GND, or ΔVsig is smaller, the leakage current further decreases. Therefore, the signal quality deteriorates less.

In this embodiment, both the sampling transistor 308 and the analog memory reset transistor 312 are configured as the N-type transistors. However, one of the sampling transistor 308 and the analog memory reset transistor 312 may be configured as an N-type transistor and the other thereof may be configured as a P-type transistor. Even in this case, the leakage current decreases more than when both the sampling transistor 308 and the analog memory reset transistor 312 are configured as P-type transistors. Thus, the signal quality deteriorates less.

In this embodiment, as described above, the voltage necessary for the current source is ensured and the potential difference between the back gate of the transistor and the reference voltage VREF is small. Thus, when the P-type transistors and the N-type transistors in FIG. 11 are substituted, the same advantages can be obtained.

The embodiments of the invention have been described in detail with reference to the drawings, but specific configurations are not limited to the above-described embodiments. The invention also includes design modifications within the scope of the invention without departing from the gist of the invention. For example, the imaging device to which the invention is applied may be an electronic device having an imaging function or may be not only a digital camera but also a video camera, an endoscope, and the like. The configuration of the solid-state imaging device in which two substrates are connected via the connection portions has been described. However, three or more substrates may be connected via the connection portions. In the case of a solid-state imaging device in which three or more substrates are connected via the connection portions, two of the three or more substrates correspond to the first and second substrates.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A solid-state imaging device comprising:
a first substrate;
a second substrate electrically connected to the first substrate; and
circuit elements disposed in the first substrate and in the second substrate, and forming pixels,
wherein each of the pixels comprising:
   photoelectric conversion units disposed in the first substrate;
   a first transistor disposed in the first substrate or in the second substrate, formed at a first conductive type well layer, and configured to amplify a signal generated by the photoelectric conversion units and to output the amplified signal;
   a signal storage circuit disposed in the second substrate, and configured to store the amplified signal output from the first transistors; and
   a second transistor disposed in the second substrate, having a source terminal or a drain terminal connected to the signal storage circuit, and formed at a second conductive type well layer which is different from the first conductive type well layer,
wherein a difference between a potential of a back gate of the second transistor and a potential at a time of resetting the signal storage circuit is less than a difference between a potential of a back gate of the first transistor and the potential at the time of resetting the signal storage circuit.

2. The solid-state imaging device according to claim 1,
wherein each of the pixels further comprises a third transistor disposed in the second substrate, and formed at the first conductive type well layer, and
wherein, in the second substrate, the first conductive type well layer or the second conductive type well layer is shared between the pixels adjacent to each other.

3. The solid-state imaging device according to claim 1,
wherein the first transistor is disposed in the first substrate, and
wherein, all of the circuit elements disposed in the second substrate are formed at the second conductive type well layer.

4. An imaging device comprising:
the solid-state imaging device according to claim 1.

* * * * *